(12) United States Patent
Chan

(10) Patent No.: US 10,884,298 B2
(45) Date of Patent: Jan. 5, 2021

(54) MANUFACTURING METHOD OF FLEXIBLE DISPLAY APPARATUS

(71) Applicant: E Ink Holdings Inc., Hsinchu (TW)

(72) Inventor: Lih-Hsiung Chan, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 16/241,998

(22) Filed: Jan. 8, 2019

(65) Prior Publication Data
US 2019/0150283 A1 May 16, 2019

Related U.S. Application Data

(60) Division of application No. 15/073,578, filed on Mar. 17, 2016, now abandoned, which is a continuation-in-part of application No. 13/950,303, filed on Jul. 25, 2013, now Pat. No. 9,326,388.

(30) Foreign Application Priority Data

Nov. 26, 2012 (TW) .............................. 101144165 A

(51) Int. Cl.
*G02F 1/1345* (2006.01)
*H05K 1/18* (2006.01)
*H05K 1/02* (2006.01)
*H05K 3/30* (2006.01)
*H05K 3/32* (2006.01)

(52) U.S. Cl.
CPC ........ *G02F 1/13452* (2013.01); *G02F 1/1345* (2013.01); *H05K 1/028* (2013.01); *H05K 1/181* (2013.01); *H05K 1/189* (2013.01); *H05K 3/305* (2013.01); *H05K 3/323* (2013.01); *H05K 2201/10136* (2013.01); *H05K 2201/10977* (2013.01)

(58) Field of Classification Search
CPC .......................... G02F 1/1345; G02F 1/13452
See application file for complete search history.

(56) References Cited

U.S. PATENT DOCUMENTS

| | | | |
|---|---|---|---|
| 6,265,986 B1* | 7/2001 | Oka | G02F 1/13452 340/815.52 |
| 9,128,337 B2* | 9/2015 | Lee | G02F 1/13452 |
| 2010/0002404 A1* | 1/2010 | Fujita | H05K 1/0271 361/752 |
| 2010/0323576 A1* | 12/2010 | Hsiao | G02F 1/133305 445/24 |
| 2011/0102729 A1* | 5/2011 | Kawamura | H05K 3/0052 349/158 |

\* cited by examiner

*Primary Examiner* — Dung T Nguyen
(74) *Attorney, Agent, or Firm* — JCIPRNET

(57) ABSTRACT

A manufacturing method of a flexible display apparatus is provided. A flexible display panel is formed on the substrate. The flexible display panel has a display area and a bonding area located outside the display area. A driving chip is bonded on the bonding area of the flexible display panel via at least one flexible circuit board. A hot-melt protective layer is formed on the display area and the bonding area of the flexible display panel and a portion of the flexible circuit board. A heating step is performed to soften the hot-melt protective layer. The flexible display panel is separated from the substrate.

6 Claims, 9 Drawing Sheets

MANUFACTURING METHOD OF FLEXIBLE DISPLAY APPARATUS

CROSS-REFERENCE TO RELATED APPLICATION

This application is a divisional of an application Ser. No. 15/073,578, filed on Mar. 17, 2016. The prior U.S. application Ser. No. 15/073,578 is a continuation-in-part application of and claims the priority benefit of U.S. application Ser. No. 13/950,303, filed Jul. 25, 2013, now patented as U.S. Pat. No. 9,326,388B2, issued on Apr. 26, 2016, which claims the priority benefit of Taiwan Application No. 101144165, filed on Nov. 26, 2012. The entirety of each of the above-mentioned patent applications is hereby incorporated by reference herein and made a part of this specification.

BACKGROUND OF THE INVENTION

Field of the Invention

The invention relates to a manufacturing method of a display apparatus, and more particularly to a manufacturing method of a flexible display apparatus.

Description of Related Art

With rapid development of display technologies, conventional cathode ray tube (CRT) displays have been gradually replaced by flat panel displays (FPD). In comparison with the FPD formed by a rigid substrate (e.g. a glass substrate), a flexible display in which an active device is formed on a flexible substrate has been developed according to recent researches because the flexible substrate (e.g. a plastic substrate or a metal thin plate) is characterized by flexibility and impact endurance.

Generally speaking, if an active device is to be formed on a flexible substrate, the flexible substrate is often adhered to the rigid substrate, and then a series of transistor manufacturing process (a scan line, data line, pixel unit, storage capacitor, gate insulation layer, protection layer, and etc.) can be performed to form a flexible display panel. Thereafter, a driving chip (e.g. a scan driving chip and a data driving chip) is disposed on a trace layer in a periphery area of the flexible display panel by chip on glass (COG) bonding technique to be electrically connected to the driving chip and the flexible display panel. After all the processes are completely performed, the flexible display panel is removed from the rigid substrate.

However, since a pin of the driving chip has rigidity and is not flexible, when removing the flexible display panel from the rigid substrate, the pin of the driving chip is likely to be broken or the trace layer in the periphery area of the flexible display panel is likely to have a broken line or a break, causing a defect in the panel or reducing the reliability of the flexible display.

SUMMARY OF THE INVENTION

The invention provides a flexible display apparatus having a better reliability.

The invention provides a manufacturing method of a flexible display apparatus for manufacturing the aforementioned flexible display apparatus.

The invention provides a flexible display apparatus, including a flexible display panel, a flexible circuit board, a driving chip, and a sealing layer. The flexible display panel has a display area and a bonding area located outside the display area. The flexible circuit board is disposed in the bonding area of the flexible display panel. The driving chip is disposed on the flexible circuit board. The sealing layer encapsulates a periphery of the flexible display panel and extendedly covers the bonding area and a portion of the flexible circuit board.

In one embodiment of the invention, the flexible display apparatus further includes an anisotropic conductive film disposed between the flexible circuit board and the bonding area of the flexible display panel, wherein the flexible circuit board is electrically connected to the flexible display panel via the anisotropic conductive film.

In one embodiment of the invention, the anisotropic conductive film includes an adhesive and a plurality of conductive particles. The conductive particles are distributed in the adhesive, wherein a diameter of each of the conductive particles ranges from 1 nm to 5 nm.

In an embodiment of the invention, a location of the driving chip does not overlap with a location of the flexible display panel.

In an embodiment of the invention, the flexible display apparatus further includes an external circuit connected to the flexible circuit board; the flexible display panel is electrically connected to the external circuit via the flexible circuit board.

In an embodiment of the invention, the flexible display apparatus further includes a protective layer disposed on a bottom surface of the flexible display panel and covering the bottom surface.

In an embodiment of the invention, the flexible display apparatus further includes a protective layer disposed on a top surface of the flexible display panel, and the sealing layer covering the flexible circuit board and the protective layer.

The invention further provides a flexible display apparatus, including a flexible display panel, a flexible circuit board, a driving chip, and a hot-melt protective layer. The flexible display panel has a display area and a bonding area located outside the display area. The flexible circuit board is disposed in the bonding area of the flexible display panel. The driving chip is disposed on the flexible circuit board. The hot-melt protective layer covers the display area and the bonding area of the flexible display panel and a portion of the flexible circuit board.

In an embodiment of the invention, the flexible display apparatus further includes an anisotropic conductive film disposed between the flexible circuit board and the bonding area of the flexible display panel, wherein the flexible circuit board is electrically connected to the flexible display panel via the anisotropic conductive film.

In an embodiment of the invention, the anisotropic conductive film includes an adhesive and a plurality of conductive particles. The conductive particles are distributed in the adhesive, wherein a diameter of each of the conductive particles ranges from 1 nm to 5 nm.

In an embodiment of the invention, a location of the driving chip does not overlap with a location of the flexible display panel.

In an embodiment of the invention, the flexible display apparatus further includes an external circuit connected to the flexible circuit board, wherein the flexible display panel is electrically connected to the external circuit via the flexible circuit board.

In an embodiment of the invention, the flexible display apparatus further includes a protective layer disposed on a bottom surface of the flexible display panel and covering the bottom surface.

In an embodiment of the invention, a material of the protective layer includes polyethylene terephthalate (PET).

In an embodiment of the invention, a material of the hot-melt protective layer includes polyethylene terephthalate mixed with a hot-melt material, a weight percentage of the hot-melt material is 30% to 60%, and the hot-melt material includes Polyurethane (PU) or Ethylene-Vinyl Acetate (EVA).

The invention further provides a manufacturing method of a flexible display apparatus, including steps of providing a substrate, forming a flexible display panel on the substrate, wherein the flexible display panel has a display area and a bonding area located outside the display area, bonding a driving chip on the bonding area of the flexible display panel via at least one flexible circuit board, forming a hot-melt protective layer on the display area and the bonding area of the flexible display panel and a portion of the flexible circuit board, performing a heating step to soften the hot-melt protective layer, and separating the flexible display panel from the substrate.

In an embodiment of the invention, the step of forming the flexible display panel on the substrate includes forming an adhesive layer on the substrate, and forming the flexible display panel on the substrate, wherein the flexible display panel is adhered to the substrate via the adhesive layer.

In an embodiment of the invention, the driving chip is disposed on the flexible circuit board, and a location of the driving chip does not overlap with a location of the flexible display panel.

In an embodiment of the invention, the flexible circuit board is bonded to the bonding area of the flexible display panel via an anisotropic conductive film.

In an embodiment of the invention, the manufacturing method of the flexible display apparatus further includes bonding an external circuit to the flexible circuit board after separating the flexible display panel from rigid substrate, wherein the flexible display panel is electrically connected to the external circuit via the flexible circuit board.

In an embodiment of the invention, a temperature of the heating step is between 70° C. and 140° C.

In an embodiment of the invention, the manufacturing method of the flexible display apparatus further includes bonding a protective layer to a bottom surface of the flexible display panel after separating the flexible display panel from the substrate.

Based on the above, since the flexible display apparatus in the embodiments of the invention adopts a chip on film (COF) technique that allows the driving chip to be disposed on the flexible display panel, the driving chip disposed on the flexible circuit board is not bended easily (the flexible circuit board is the one bended by stress). Therefore, the situation in which the pin of a conventional driving chip is broken may be avoided. In addition, since the flexible display apparatus in the embodiments of the invention has a sealing layer or a hot-melt protective layer, when separating the flexible display panel from the rigid substrate, the sealing layer or the hot-melt protective layer may reinforce a structure strength between the flexible display panel and the flexible circuit board so as to further enhance an overall structural reliability of the flexible display apparatus.

In order to make the aforementioned features and advantages of the invention more comprehensible, embodiments accompanying figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DESCRIPTION OF EMBODIMENTS

Figure 1A:
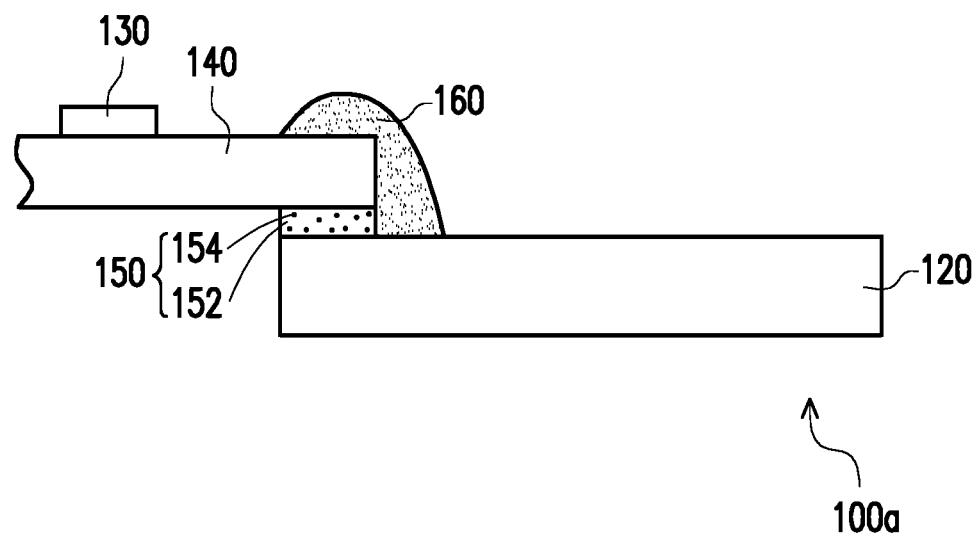
FIG. 1A illustrates a schematic cross-sectional view of a flexible display apparatus in an embodiment of the invention.
Figure 1B:
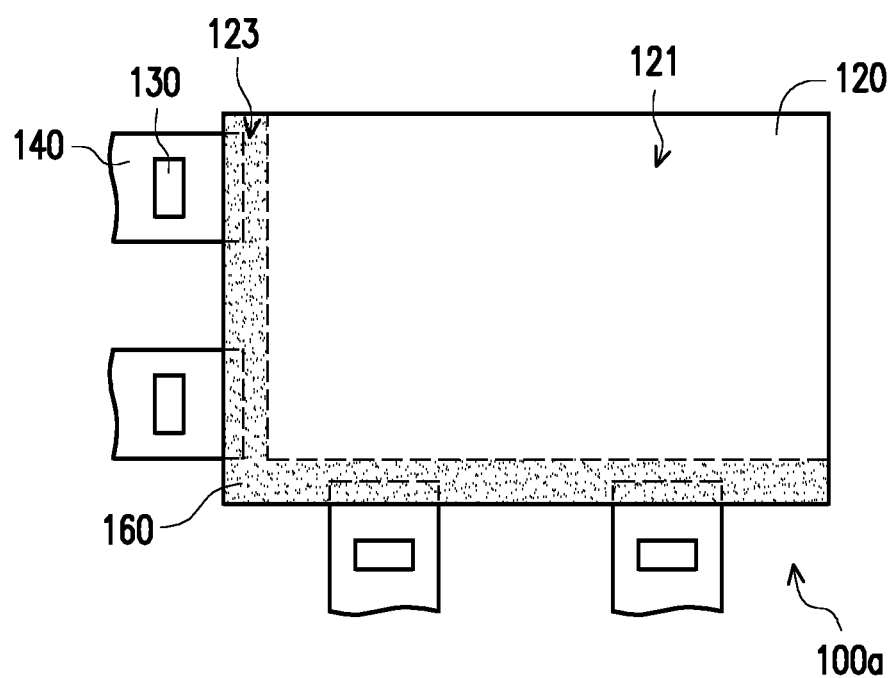
FIG. 1B illustrates a schematic top view of the flexible display apparatus in FIG. 1A.

FIG. 1A illustrates a schematic cross-sectional view of a flexible display apparatus in an embodiment of the invention. FIG. 1B illustrates a schematic top view of the flexible display apparatus in FIG. 1A. With reference to both to FIGS. 1A and 1B, a flexible display apparatus 100a in the embodiment includes a flexible display panel 120, at least one driving chip 130, at least one flexible circuit boards 140, and a sealing layer 160. The flexible display panel 120 has a display area 121 and the bonding area 123 located outside the display area 121. The flexible circuit boards 140 are disposed in the bonding area 123 of the flexible display panel 120. The driving chips 130 are disposed on the flexible circuit boards 140. The sealing layer 160 encapsulates a periphery of the flexible display panel 120 and extendedly covers the bonding area 123 and a portion of the flexible circuit boards 140.

More specifically, the flexible display panel 120 in the embodiment may be a flexible low-temperature polysilicon thin-film-transistor liquid crystal display panel, a flexible amorphous-Silicon thin-film-transistor liquid crystal display panel, a flexible polycrystalline silicon thin-film-transistor liquid crystal display panel, a flexible electrophoretic display panel, or a flexible organic electroluminescent display panel, however, the invention is not limited thereto.

With reference to FIGS. 1A and 1B again, the driving chips 130 of the present embodiment are respectively disposed on the flexible circuit board 140, and the flexible circuit boards 140 are bonded to the bonding area 123 of the flexible display panel 120 via an anisotropic conductive film 150. In other words, the anisotropic conductive film 150 is disposed between the flexible circuit board 140 and the bonding area 123 of the flexible display panel 120, wherein the flexible circuit board 140 is electrically connected to the flexible display panel 120 via the anisotropic conductive film 150. Specifically, locations of the driving chips 130 in the embodiment do not overlap with a location of the flexible display panel 120. The anisotropic conductive film 150 includes an adhesive 152 and a plurality of conductive particles 154. The conductive particles 154 are distributed in the adhesive 152, wherein a diameter of each of the conductive particles 154 ranges from 1 nm to 5 nm. In the embodiment, the driving chips 130 are, for example, signal line driving chip or scan line driving chip, however, the invention is not limited thereto.

Since the driving chips 130 of the flexible display apparatus 100a in the embodiment are disposed on the flexible display panel 120 via the flexible circuit boards 140 (i.e. the chip on film (COF) technique), the driving chips 130 disposed on the flexible circuit boards 140 are not bended easily (the flexible circuit boards 140 are the one bended by stress). Therefore, the situation in which the pin of a conventional driving chip is broken may be avoided. In addition, since the flexible display apparatus 100a in the embodiment has the sealing layer 160, wherein the sealing layer 160 encapsulates the periphery of the flexible display panel 120 and extendedly covers the bonding area 123 and the flexible circuit boards 140, the sealing layer 160 may reinforce a structure strength between the flexible display panel 120 and the flexible circuit boards 140 so as to further enhance an overall structural reliability of the flexible display apparatus 100a. In brief, the flexible display apparatus 100a in the embodiment has a higher structural reliability.

It needs to be indicated that the reference numbers and a part of the content referred in the previous embodiments are recited in the following embodiments, wherein the same reference numbers are used to represent the same or similar devices, and the description of the same technical content is omitted. Please refer to the previous embodiments for the omitted description. The same description is not repeated in the following embodiments.

Figure 2:
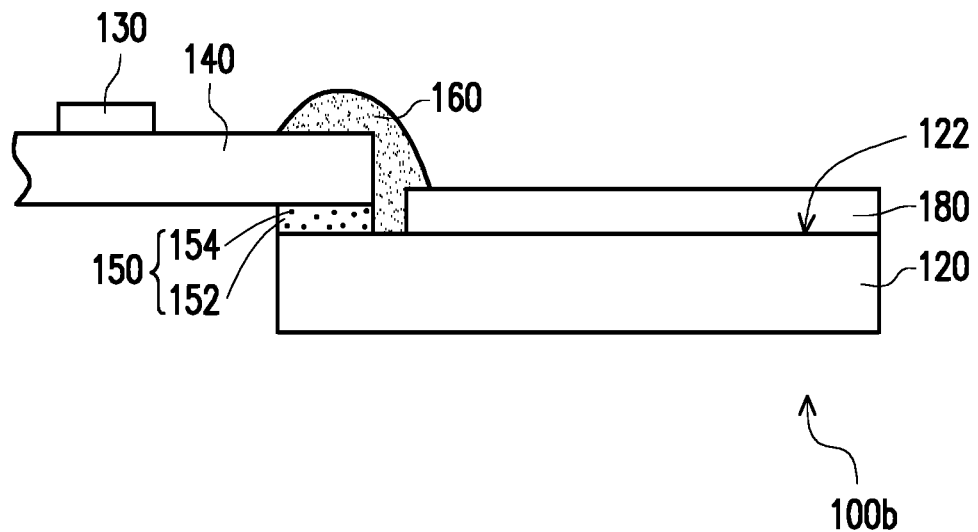
FIG. 2 illustrates a schematic cross-sectional view of a flexible display apparatus in another embodiment of the invention.

FIG. 2 illustrates a schematic cross-sectional view of a flexible display apparatus in another embodiment of the invention. With reference to both FIGS. 1A and 2, a flexible display apparatus 100b in FIG. 2 is similar to the flexible display apparatus 100a in FIG. 1A, while the main difference therebetween lies in that the flexible display apparatus 100b in the embodiment further includes a protective layer 180 disposed on a top surface 122 of the flexible display panel 120 for protecting the top surface 122 of the flexible display panel 120. Herein, the sealing layer 160 covers the flexible circuit board 140 and a portion of the protective layer 180. A material of the protective layer 180 includes polyethylene terephthalate (PET).

Figure 3:
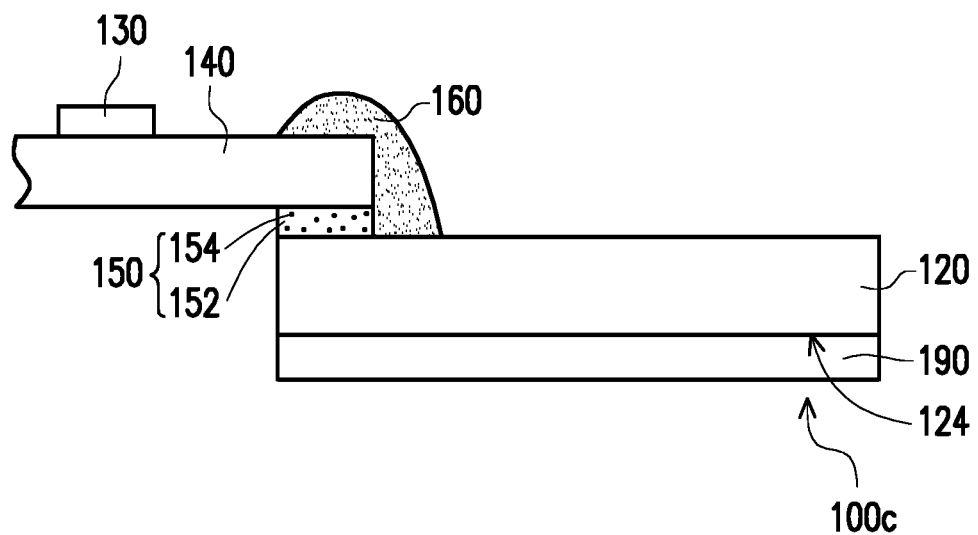
FIG. 3 illustrates a schematic cross-sectional view of a flexible display apparatus in another embodiment of the invention.

FIG. 3 illustrates a schematic cross-sectional view of a flexible display apparatus in another embodiment of the invention. With reference to both FIGS. 1A and 3, a flexible display apparatus 100c in FIG. 3 is similar to the flexible display apparatus 100a in FIG. 1A, while the main difference therebetween lies in that the flexible display apparatus 100c in the embodiment further includes a protective layer 190 disposed on a bottom surface 124 of the flexible display panel 120 and covering the bottom surface 124 for strengthening the stability of the flexible display panel 120 and providing waterproof function. A material of the protective layer 190 includes polyethylene terephthalate (PET).

Figure 4:
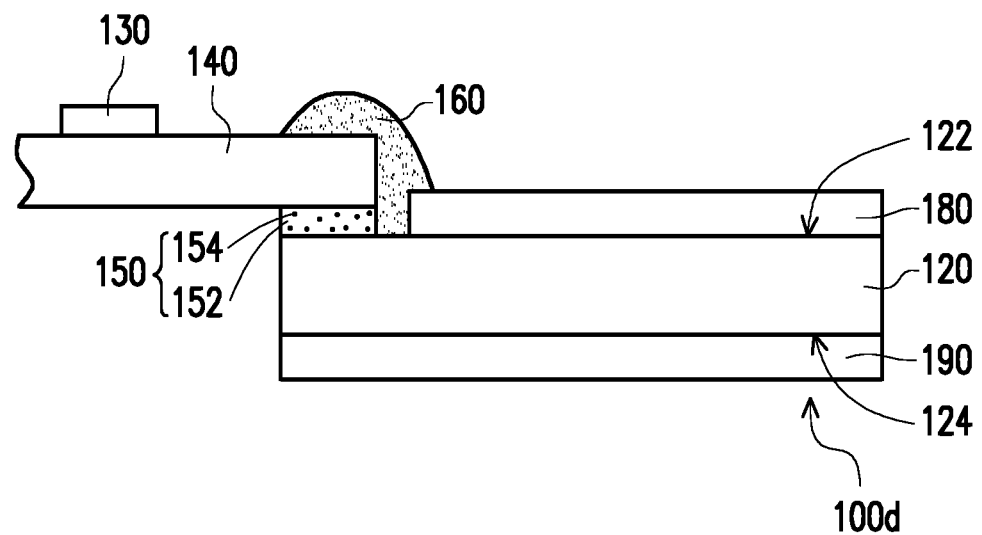
FIG. 4 illustrates a schematic cross-sectional view of a flexible display apparatus in another embodiment of the invention.

FIG. 4 illustrates a schematic cross-sectional view of a flexible display apparatus in another embodiment of the invention. With reference to both FIGS. 1A and 4, a flexible display apparatus 100d in FIG. 4 is similar to the flexible display apparatus 100a in FIG. 1A, while the main difference therebetween lies in that the flexible display apparatus 100d in the embodiment further includes a protective layer 180 disposed on a top surface 122 of the flexible display panel 120 for protecting the top surface 122 of the flexible display panel 120, and a protective layer 190 disposed on a bottom surface 124 of the flexible display panel 120 for strengthening the stability of the flexible display panel 120 and providing waterproof function. Herein, the sealing layer 160 covers the flexible circuit board 140 and a portion of the protective layer 180, and the protective layer 190 completely covers the bottom surface 124. A material of the protective layer 180 and a material of the protective layer 190 include polyethylene terephthalate (PET).

Figure 5:
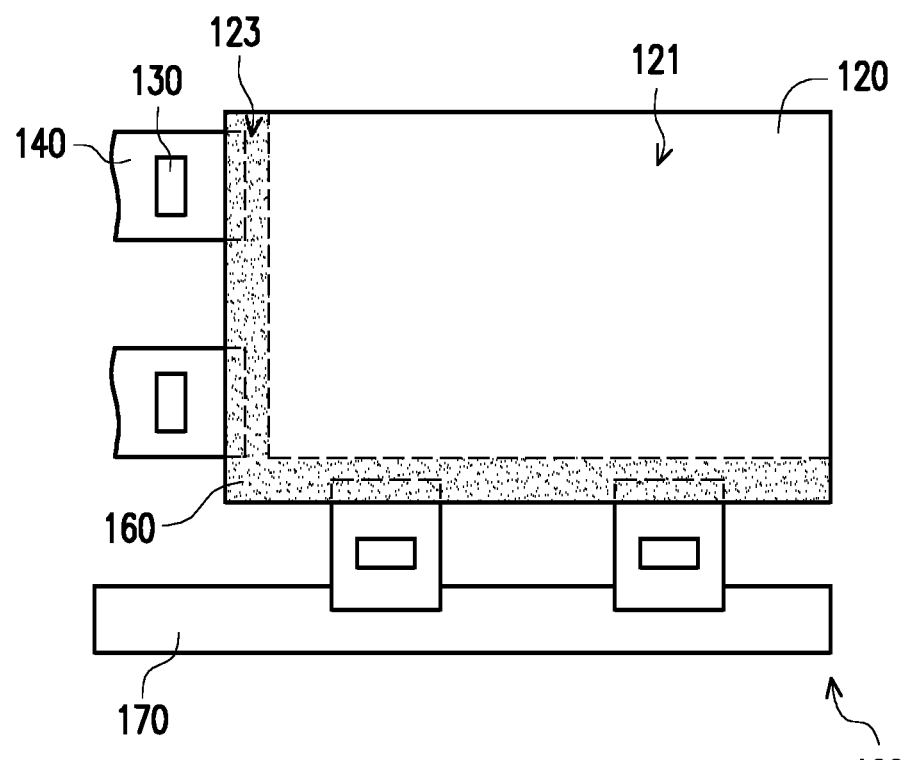
FIG. 5 illustrates a schematic top view of a flexible display apparatus in another embodiment of the invention.

FIG. 5 illustrates a schematic top view of a flexible display apparatus in another embodiment of the invention. With reference to both FIGS. 1B and 5, a flexible display apparatus 100e in FIG. 5 is similar to the flexible display apparatus 100a in FIG. 1B, while the main difference therebetween lies in that the flexible display apparatus 100e in the embodiment further includes an external circuit 170, wherein the external circuit 170 is connected to a portion of the flexible circuit boards 140 and the flexible display panel 120 is electrically connected to the external circuit 170 via the flexible circuit boards 140. In the embodiment, the external circuit 170 is, for example, a flexible printed circuit (FPC) board, but the invention is not limited thereto.

Figure 6:
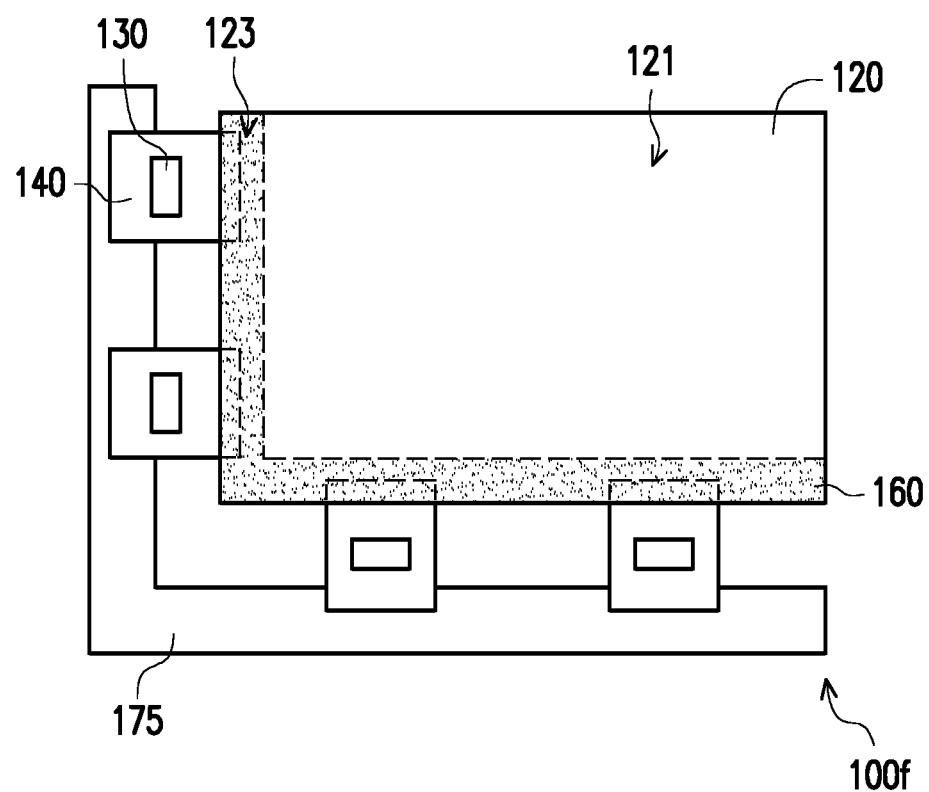
FIG. 6 illustrates a schematic top view of a flexible display apparatus in another embodiment of the invention.

It should be mentioned that the invention provides no limitation to the shape structure and disposition of the external circuit 170. Although the specific shape of the external circuit 170 referred in the embodiment is in a rectangle and is electrically connected only to the portion of the flexible circuit boards 140, in other embodiments, please refer to FIG. 6, a shape of the external circuit 175 of the flexible display apparatus 100f may also be in an L shape and the external circuit 175 is electrically connected to the whole flexible circuit boards 140, which is also an adoptable technical solution in the invention and does not depart from the scope to be protected in the invention.

Figure 7A:
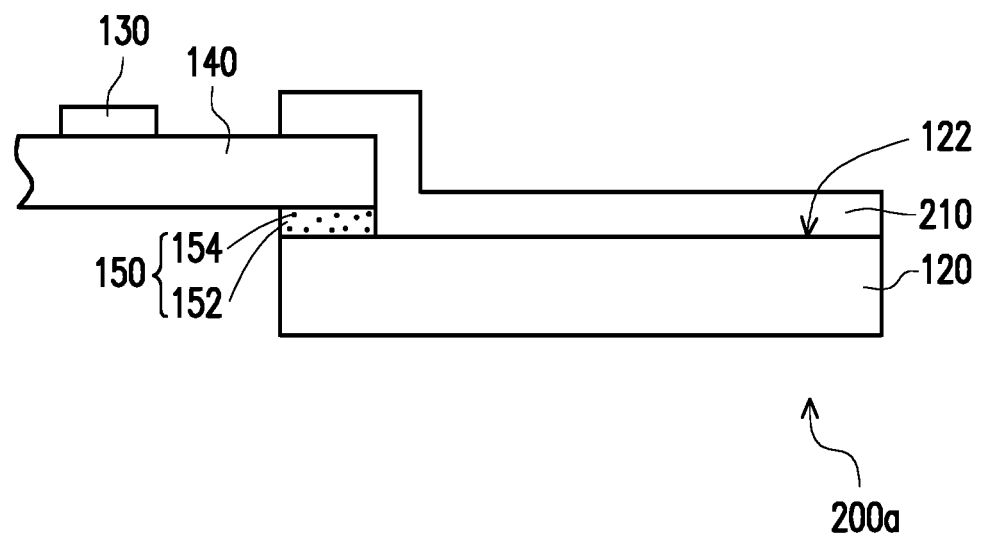
FIG. 7A illustrates a schematic cross-sectional view of a flexible display apparatus in an embodiment of the invention.
Figure 7B:
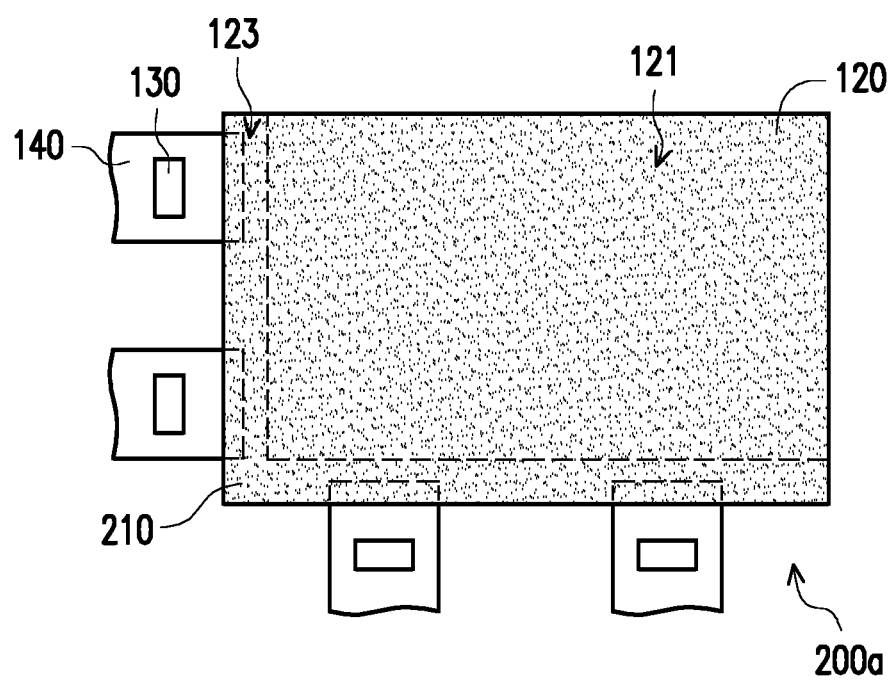
FIG. 7B illustrates a schematic top view of the flexible display apparatus in FIG. 7A.

FIG. 7A illustrates a schematic cross-sectional view of a flexible display apparatus in an embodiment of the invention. FIG. 7B illustrates a schematic top view of the flexible display apparatus in FIG. 7A. With reference to both FIGS. 7A and 7B, a flexible display apparatus 200a in FIGS. 7A and 7B is similar to the flexible display apparatus 100a in FIGS. 1A and 1B, while the main difference therebetween lies in that the flexible display apparatus 200a in the embodiment uses a hot-melt protective layer 210 instead of the sealing layer 160. In more detail, the hot-melt protective layer 210 in the present embodiment covers the display area 121 and the bonding area 123 of the flexible display panel 120 and a portion of the flexible circuit board 140. Herein, a material of the hot-melt protective layer 210 includes polyethylene terephthalate mixed with a hot-melt material, a weight percentage of the hot-melt material is 30% to 60%, and the hot-melt material includes Polyurethane (PU) or Ethylene-Vinyl Acetate (EVA).

A method of manufacturing the flexible display apparatus 200a in the present embodiment is described as follows.

Figure 8A:
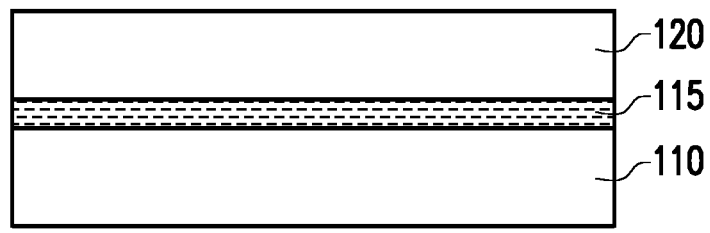
FIGS. 8A to 8E illustrate a schematic cross-sectional view of a manufacturing method of a flexible display apparatus in an embodiment of the invention.

FIGS. 8A to 8E illustrate a schematic cross-sectional view of a manufacturing method of a flexible display apparatus in an embodiment of the invention. As indicated in FIG. 8A, according to the manufacturing method of the flexible display apparatus 200a in the embodiment, first of all, a rigid substrate 110 is provided, wherein the rigid substrate 110 is, for example, a glass substrate or a substrate formed of other appropriate materials for being used as a supporter.

Next, please refer to both FIGS. 7B and 8A. A flexible display panel 120 is formed on the rigid substrate 110, wherein the flexible display panel 120 has a display area 121 and a bonding area 123 located outside the display area 121. In the embodiment, a shape of the bonding area 123 of the flexible display panel 120 is, for example, in an L shape, however, the invention is not limited thereto.

More specifically, before the flexible display panel 120 is formed on the rigid substrate 110, an adhesive layer 115 is formed on the rigid substrate 110, and the flexible display panel 120 in the embodiment is adhered to the rigid substrate 110 via the adhesive layer 115. In the embodiment, the flexible display panel 120 may be a flexible low-temperature polysilicon thin-film-transistor liquid crystal display panel, a flexible amorphous-Silicon thin-film-transistor liquid crystal display panel, a flexible polycrystalline silicon thin-film-transistor liquid crystal display panel, a flexible electrophoretic display panel, or a flexible organic electroluminescent display panel, however, the invention is not limited thereto.

Figure 8B:
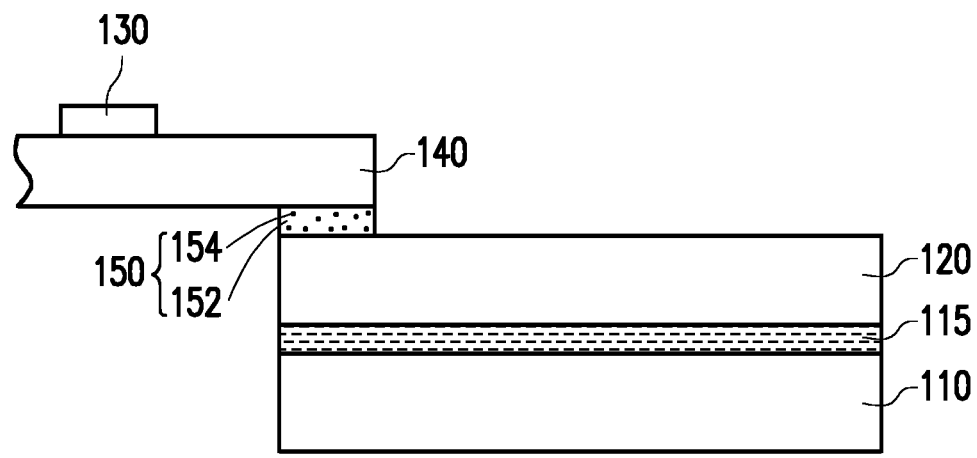

With reference to both FIGS. 7B and 8B, at least one driving chip 130 (a plurality of driving chips are schematically illustrated in FIG. 7B) is bonded to the bonding area 123 of the flexible display panel 120 via at least one flexible circuit board 140 (a plurality of flexible circuit boards are schematically illustrated in FIG. 7B). In the embodiment, the driving chips 130 are respectively disposed on the flexible circuit board 140, and the flexible circuit boards 140 are bonded to the bonding area 123 of the flexible display panel 120 via an anisotropic conductive film 150. The anisotropic conductive film 150 in the present embodiment includes an adhesive 152 and a plurality of conductive particles 154. The conductive particles 154 are distributed in the adhesive 152, wherein a diameter of each of the conductive particles 154 ranges from 1 nm to 5 nm. Specifically, locations of the driving chips 130 in the embodiment do not overlap with a location of the flexible display panel 120. In the embodiment, the driving chips 130 are, for example, signal line driving chip or scan line driving chip, however, the invention is not limited thereto.

Figure 8C:
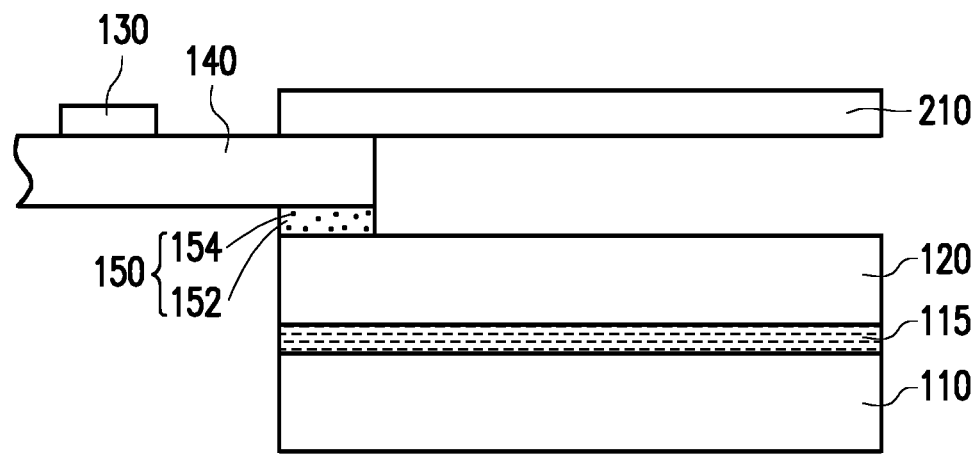

With reference to both FIGS. 7B and 8C, a hot-melt protective layer 210 is formed on the display area 121 and the bonding area 123 of the flexible display panel 120 and a portion of the flexible circuit board 140. Herein, a material of the hot-melt protective layer 210 includes polyethylene terephthalate (PET) mixed with a hot-melt material, a weight percentage of the hot-melt material is 30% to 60%, and the hot-melt material includes Polyurethane (PU) or Ethylene-Vinyl Acetate (EVA).

Figure 8D:
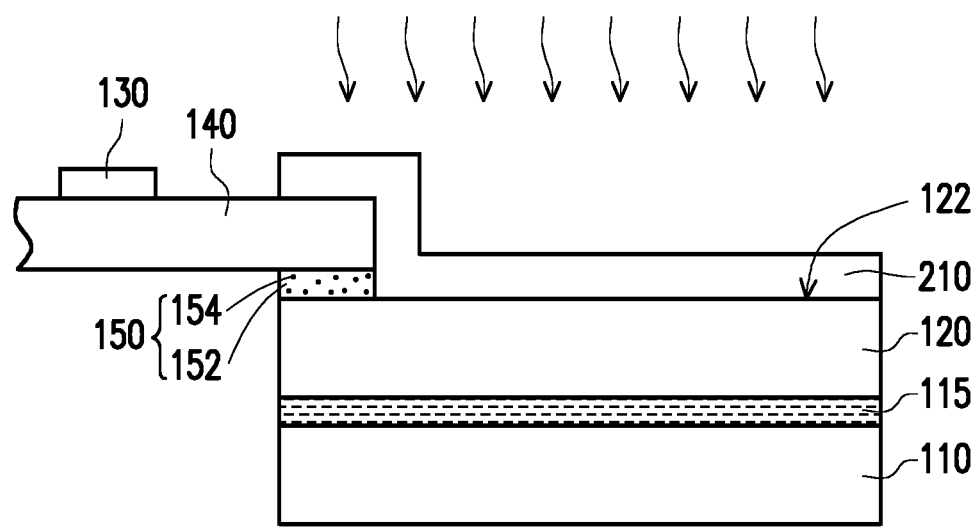

With reference to both FIGS. 7B and 8D, a heating step is performed to soften the hot-melt protective layer 210, so that the hot-melt protective layer 210 adheres to a top surface 122 of the flexible display panel 120 and a portion of the flexible circuit board 140. Herein, a temperature of the heating step is between 70° C. and 140° C., and a duration of the heating step is between 1 minute and 30 minutes.

Figure 8E:
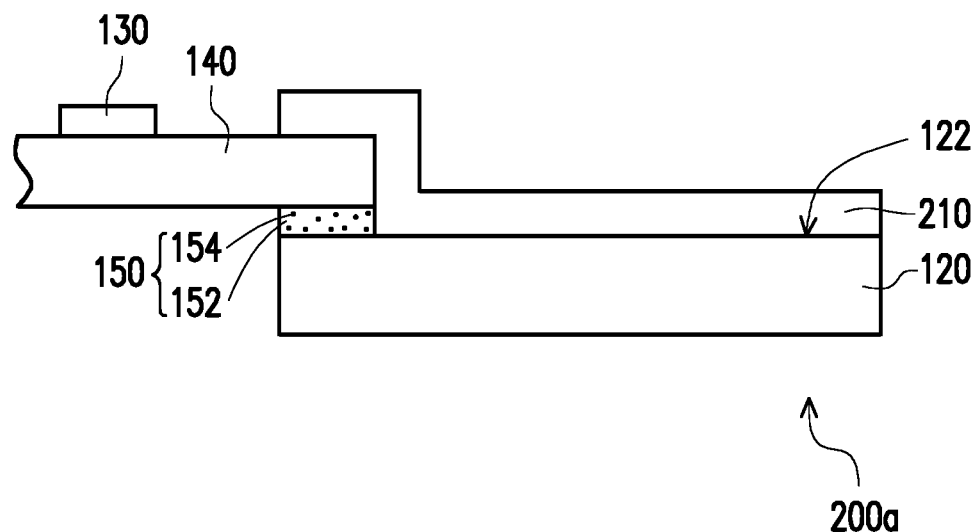

Finally, with reference to both FIGS. 7B and 8E, the flexible display panel 120 is separated from the rigid substrate 110 to form a flexible display apparatus 200a, which is the final step of completing manufacturing the flexible display apparatus 200a.

Since the flexible display apparatus 200a in the present embodiments adopts a chip on film (COF) technique that allows the driving chip 130 to be disposed on the flexible display panel 120, when separating the flexible display panel 120 from the rigid substrate 110, the driving chip 130 disposed on the flexible circuit board 140 is not bended easily (the flexible circuit board 140 is the one bended by stress). Therefore, the situation in which the pin of a conventional driving chip is broken may be avoided. In addition, since the flexible display apparatus 200a in the embodiments of the invention has a hot-melt protective layer 210, wherein the hot-melt protective layer 210 completely covers the display area 121 and the bonding area 123 of the flexible display panel 120 and extendedly covers a portion of the flexible circuit board 140, when separating the flexible display panel 120 from the rigid substrate 110, the hot-melt protective layer 210 may reinforce a structure strength between the flexible display panel 120 and the flexible circuit board 140 so as to further enhance an overall structural reliability of the flexible display apparatus 200a.

Figure 9:
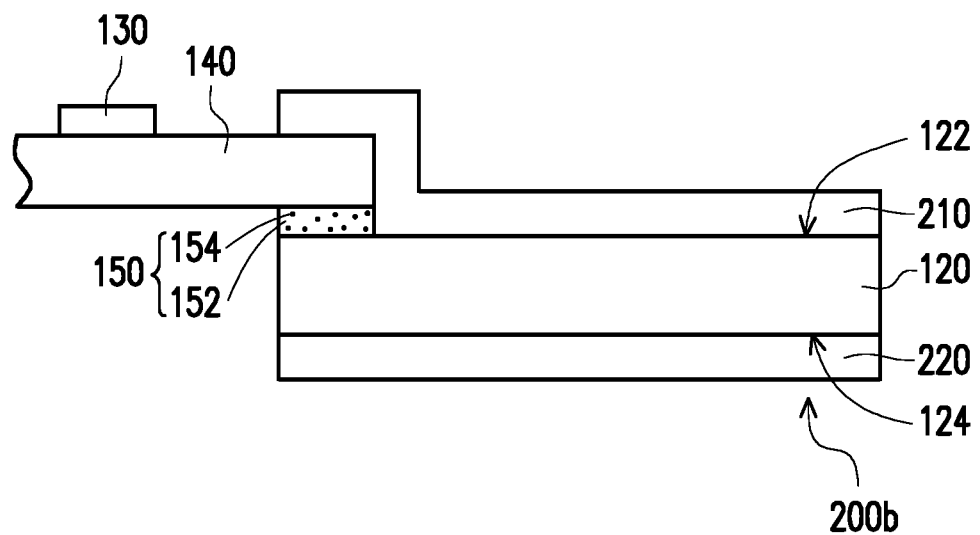
FIG. 9 illustrates a schematic cross-sectional view of a flexible display apparatus in another embodiment of the invention.

FIG. 9 illustrates a schematic cross-sectional view of a flexible display apparatus in another embodiment of the invention. With reference to both FIGS. 7A and 9, a flexible display apparatus 200b in FIG. 9 is similar to the flexible display apparatus 200a in FIG. 7A, while the main difference therebetween lies in that the flexible display apparatus 200b in the embodiment further includes a protective layer 220 disposed on a bottom surface 124 of the flexible display panel 120 and covering the bottom surface 124 for strengthening the stability of the flexible display panel 120 and providing waterproof function. A material of the protective layer 220 includes polyethylene terephthalate (PET).

Figure 10:
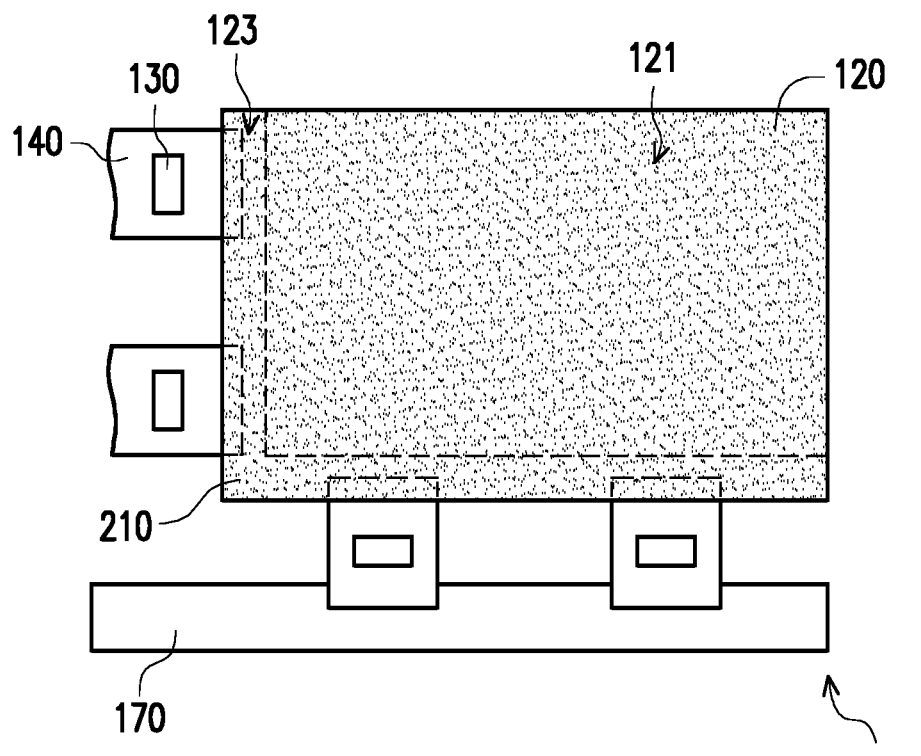
FIG. 10 illustrates a schematic top view of a flexible display apparatus in another embodiment of the invention.

FIG. 10 illustrates a schematic top view of a flexible display apparatus in another embodiment of the invention. With reference to both FIGS. 7B and 10, a flexible display apparatus 200c in FIG. 10 is similar to the flexible display apparatus 200a in FIG. 7B, while the main difference therebetween lies in that the flexible display apparatus 200c in the embodiment further includes an external circuit 170, wherein the external circuit 170 is connected to a portion of the flexible circuit boards 140 and the flexible display panel 120 is electrically connected to the external circuit 170 via the flexible circuit boards 140. In the embodiment, the external circuit 170 is, for example, a flexible printed circuit (FPC) board, but the invention is not limited thereto.

Figure 11:
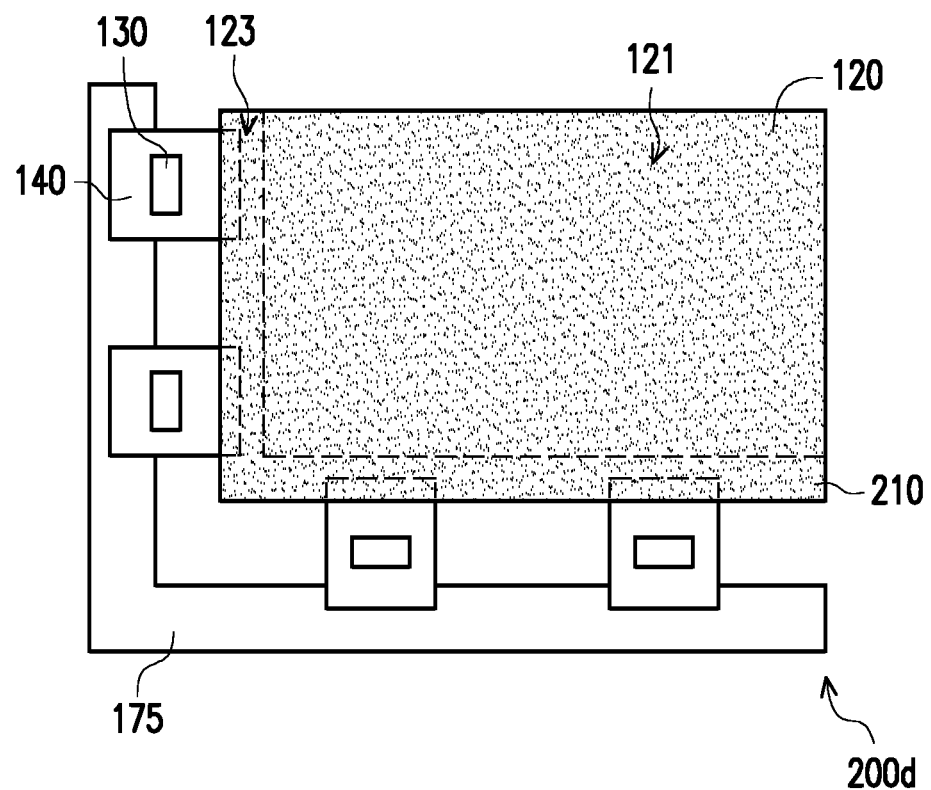
FIG. 11 illustrates a schematic top view of a flexible display apparatus in another embodiment of the invention.

It should be mentioned that the invention provides no limitation to the shape structure and disposition of the external circuit 170. Although the specific shape of the external circuit 170 referred in the embodiment is in a rectangle and is electrically connected only to the portion of the flexible circuit boards 140, in other embodiments, please refer to FIG. 11, a shape of the external circuit 175 of the flexible display apparatus 200d may also be in an L shape and the external circuit 175 is electrically connected to the whole flexible circuit boards 140, which is also an adoptable technical solution in the invention and does not depart from the scope to be protected in the invention.

To sum up, since the flexible display apparatus in the embodiments of the invention adopts a chip on film (COF) technique that allows the driving chip to be disposed on the flexible display panel, the driving chip disposed on the flexible circuit board is not bended easily (the flexible circuit board is the one bended by stress). Therefore, the situation in which the pin of a conventional driving chip is broken may be avoided. In addition, since the flexible display apparatus in the embodiments of the invention has a sealing layer or a hot-melt protective layer, when separating the flexible display panel from the rigid substrate, the sealing layer or the hot-melt protective layer may reinforce a structure strength between the flexible display panel and the flexible circuit board so as to further enhance an overall structural reliability of the flexible display apparatus.

It will be apparent to those skilled in the art that various modifications and variations can be made to the structure of the disclosed embodiments without departing from the scope or spirit of the invention. In view of the foregoing, it is intended that the disclosure cover modifications and variations of this specification provided they fall within the scope of the following claims and their equivalents.

What is claimed is:

1. A manufacturing method of a flexible display apparatus, comprising:

providing a substrate;

forming a flexible display panel on the substrate, wherein the flexible display panel has a display area and a bonding area located outside the display area;

bonding a driving chip on the bonding area of the flexible display panel via at least one flexible circuit board;

forming a hot-melt protective layer on the display area and the bonding area of the flexible display panel and a portion of the flexible circuit board;

performing a heating step to soften the hot-melt protective layer; and separating the flexible display panel from the substrate, wherein the driving chip is disposed on the flexible circuit board, and a location of the driving chip does not overlap with a location of the flexible display panel, wherein the hot-melt protective layer adheres to a top surface of the flexible display panel facing away from the substrate.

2. The manufacturing method of the flexible display apparatus as recited in claim 1, wherein the step of forming the flexible display panel on the substrate comprises:

forming an adhesive layer on the substrate; and forming the flexible display panel on the substrate, wherein the flexible display panel is adhered to the substrate via the adhesive layer.

3. The manufacturing method of the flexible display apparatus as recited in claim 1, wherein the flexible circuit board is bonded to the bonding area of the flexible display panel via an anisotropic conductive film.

4. The manufacturing method of the flexible display apparatus as recited in claim 1, further comprising:

after separating the flexible display panel from the substrate, bonding an external circuit to the flexible circuit board, wherein the flexible display panel is electrically connected to the external circuit via the flexible circuit board.

5. The manufacturing method of the flexible display apparatus as recited in claim 1, wherein a temperature of the heating step is between 70° C. and 140° C.

6. The manufacturing method of the flexible display apparatus as recited in claim 1, further comprising:

after separating the flexible display panel from the substrate, bonding a protective layer to a bottom surface of the flexible display panel.

* * * * *